(12) United States Patent
Smith

(10) Patent No.: US 6,849,953 B2
(45) Date of Patent: Feb. 1, 2005

(54) MICROELECTRONIC ASSEMBLIES WITH COMPOSITE CONDUCTIVE ELEMENTS

(75) Inventor: John W. Smith, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/942,363

(22) Filed: Aug. 29, 2001

(65) Prior Publication Data

US 2002/0041036 A1 Apr. 11, 2002

Related U.S. Application Data

(62) Division of application No. 09/243,860, filed on Feb. 3, 1999, now Pat. No. 6,303,408.
(60) Provisional application No. 60/073,520, filed on Feb. 3, 1998.

(51) Int. Cl.[7] .............................................. H01L 23/48
(52) U.S. Cl. ..................... 257/778; 257/678; 257/687; 257/688; 438/106; 438/127; 438/597; 438/610; 438/666
(58) Field of Search ................................ 257/778, 678, 257/687, 688; 438/106, 127, 597, 610, 666

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,204,455 A | 4/1993 | Gilleo et al. | 174/261 |
| 5,349,500 A | 9/1994 | Casson et al. | 361/749 |
| 5,436,503 A | 7/1995 | Kunitomo et al. | 257/737 |
| 5,518,964 A | 5/1996 | DiStefano et al. | 437/209 |
| 5,641,996 A | 6/1997 | Omoya et al. | 257/787 |
| 5,666,008 A | 9/1997 | Tomita et al. | 257/778 |
| 5,705,858 A | 1/1998 | Tsukamoto | 257/778 |
| 5,708,304 A | 1/1998 | Tomita | 257/778 |
| 5,801,446 A | 9/1998 | DiStefano et al. | 257/778 |
| 5,802,699 A | 9/1998 | Fjelstad et al. | 29/593 |
| 5,861,666 A | 1/1999 | Bellaar | 257/686 |
| 5,885,849 A | 3/1999 | DiStefano et al. | 438/108 |
| 5,953,623 A | 9/1999 | Boyko et al. | 438/612 |
| 5,956,235 A | 9/1999 | Kresge et al. | 361/774 |
| 5,971,253 A | 10/1999 | Gilleo et al. | 228/180.22 |
| 6,043,990 A * | 3/2000 | Johnson et al. | 361/803 |
| 6,086,386 A | 7/2000 | Fjelstad et al. | 439/70 |
| 6,191,952 B1 * | 2/2001 | Jimarez et al. | 361/771 |
| 6,204,455 B1 * | 3/2001 | Gilleo et al. | 174/261 |
| 6,208,025 B1 | 3/2001 | Bellaar et al. | 257/696 |
| 6,208,156 B1 * | 3/2001 | Hembree | 324/755 |
| 6,324,754 B1 * | 12/2001 | DiStefano et al. | 29/840 |
| 6,528,894 B1 * | 3/2003 | Akram et al. | 257/788 |

FOREIGN PATENT DOCUMENTS

WO  WO 97/40958  11/1997

\* cited by examiner

Primary Examiner—Nathan J. Flynn
Assistant Examiner—Remmon R. Fordé
(74) Attorney, Agent, or Firm—Lerner, David, Littenberg, Krumholz & Mentlik, LLP

(57) ABSTRACT

A microelectronic assembly includes composite conductive elements, each incorporating a core and a coating of a low-melting conductive material. The composite conductive elements interconnect microelectronic elements. At the normal operating temperature of the assembly, the low-melting conductive material melts, allowing the cores and microelectronic elements to move relative to one another and relieve thermally-induced stress.

15 Claims, 4 Drawing Sheets

MICROELECTRONIC ASSEMBLIES WITH COMPOSITE CONDUCTIVE ELEMENTS

CROSS-REFERENCE TO RELATED APPLICATIONS

This is a divisional application of U.S. patent application Ser. No. 09/243,860 filed Feb. 3, 1999 now U.S. Pat. No. 6,303,408, which in turn claims benefit of U.S. Provisional Patent Application No. 60/073,520, filed Feb. 3, 1998.

BACKGROUND OF THE INVENTION

The present invention relates to components and methods for mounting and connecting microelectronic elements such as semiconductor chips.

Complex microelectronic devices such as semiconductor chips require numerous connections with other electronic components. Typically such semiconductor chips are mounted on external substrates such as printed circuit boards by electrically interconnecting contacts on the semiconductor chip with contact pads on the substrate. The substrate may include internal circuitry which is connected to the contact pads thereof and may be adapted to accommodate other components such as additional semiconductor chips.

Connections between microelectronic elements and substrates must meet several demanding and often conflicting requirements. The connections must provide reliable low impedance electrical interconnections. They must also withstand stresses occurring during manufacturing processes, such as the thermal effects caused by soldering. Other thermal effects occur during operation of the device. As the system operates, it generates heat which causes the chip and the substrate to expand. When operation ceases, the chip and the substrate cool down which causes the components to shrink or contract. As a result, the chip and the substrate expand and contract at different rates so that portions of the chip and substrate move relative to one another. The chip and the substrate can also warp as they are heated and cooled, thereby causing further movement of the chip relative to the substrate. The repeated expansion and contraction of the elements during operation results in severe strain on electrical elements connecting the chip and the substrate.

In response to these problems, various interconnection systems have evolved. These systems essentially seek to withstand repeated thermal cycling without breaking the electrical connections. The interconnection system should also provide a compact assembly and should be suitable for use with components having closely spaced contacts. Moreover the interconnection system should be economical. Various solutions have been proposed to meet these needs. Some embodiments of commonly assigned U.S. Pat. Nos. 5,148,265 and 5,148,266 teach that flexible leads may be provided between the contacts on a semiconductor chip or other microelectronic element and contact pads of a substrate. Preferably a compliant layer, such as an elastomer or gel, may be provided between the semiconductor chip and the substrate, whereby the flexible leads connecting the semiconductor chip and substrate extend through the compliant layer. In certain preferred embodiments, the semiconductor chip is mechanically decoupled from the substrate so that the chip and the substrate can expand and move independently of one another without placing excessive stress on the electrical connections (i.e. the flexible leads) between the chip contacts and the contact pads of the substrate. The chip and the flexible leads extending to the substrate typically occupy an area of the substrate about the same size as the chip itself.

Commonly assigned U.S. patent application Ser. No. 08/641,698, the disclosure of which is hereby incorporated by reference herein, discloses connection components for microelectronic assemblies. In accordance with certain preferred embodiments of the '698 application, the microelectronic assemblies preferably include first and second microelectronic elements having contacts thereon and a compliant dielectric material having cavities therein. Masses of a conductive material are disposed in the cavities so that the masses of the conductive material are electrically interconnected between contacts on the first microelectronic element and contacts on the second microelectronic element. Thus, each conductive mass forms part or all of a conductor extending between contacts on the two microelectronic elements. The conductive material may be a liquid or may be a fusible material adapted to liquefy at a relatively low temperature, typically below about 125° C. Preferably the conductive material in each mass is contiguous with the compliant material and is contained by the compliant material so that the conductive material remains in place when in a liquid state. The compliant material keeps the liquid masses associated with different sets of contacts separate from one another and electrically insulates the masses from one another.

Commonly assigned U.S. patent application Ser. No. 08/962,693 entitled "Microelectronic Connections with Liquid Conductive Elements," filed Nov. 3, 1997 (as a CIP of the above-mentioned '698 application), the disclosure of which is hereby incorporated by reference herein, discloses microelectronic assemblies having conductive elements which transfer heat between microelectronic elements. In certain embodiments, first and second microelectronic elements are juxtaposed with one another so that the confronting spaced apart surfaces of the first and second microelectronic elements define a space therebetween. One or more masses of a conductive material having a melting temperature below about 150° C. (hereinafter referred to as "fusible conductive material") are provided in the space. The fusible conductive material is preferably thermally conductive, electrically conductive or both. A compliant layer is provided in the space between the microelectronic elements. The fusible conductive masses are preferably contained by the compliant layer and may extend between contacts on the confronting surfaces of the first and second microelectronic elements so that the masses electrically interconnect the first and second microelectronic elements. The fusible conductive masses also preferably provide a thermal conduction path between the first and second microelectronic elements.

Commonly assigned U.S. patent application Ser. No. 08/862,151 filed May 22, 1997, the disclosure of which is hereby incorporated by reference herein, discloses connectors for microelectronic elements. In certain preferred embodiments of the '151 Application, a microelectronic element is engaged with a connecting assembly. The connecting assembly preferably includes a flexible dielectric interposer, a substrate and non-collapsible structural elements which support the flexible dielectric interposer above the substrate, leaving a standoff space between the dielectric interposer and the substrate. In one preferred embodiment a microelectronic element having a plurality of contacts protruding from the bottom surface thereof is engaged with the flexible dielectric interposer. The contact bearing surface of the microelectronic element is juxtaposed with the top surface of the flexible dielectric interposer whereby the contacts of the microelectronic element are generally in registration with an array of contacts provided on the flexible dielectric sheet. The microelectronic element is then urged downwards so that contacts engage the contact pads of the flexible dielectric sheet. Downward motion of the microelectronic element relative to the flexible dielectric sheet resiliently deforms the flexible sheet with each microelectronic element contact resiliently deflecting a surrounding portion of the flexible sheet downward into a standoff space between the flexible sheet and the substrate. As the surrounding portion of the sheet-like element is deflected into the standoff space, the flexible sheet is stretched. The structural elements overlying the substrate force the flexible sheet-like element upward as the microelectronic element contacts force the sheet-like element downward.

SUMMARY OF THE INVENTION

One aspect of the present invention provides improved microelectronic assemblies. A microelectronic assembly according to this aspect of the invention preferably includes first and second microelectronic elements and a plurality of composite conductive elements. Each composite conductive element includes a core and a layer of a conductive material surrounding the core. The conductive material preferably has a melting temperature less than about 150° C., whereas the cores have a melting temperature higher than the melting temperature of the conductive material. The conductive elements are disposed between the microelectronic elements and connect the microelectronic elements to one another. Thus, the composite conductive elements typically conduct electrical signals, heat or both between the microelectronic elements.

Typically, the microelectronic elements have a normal operating temperature range and the melting temperature of said conductive material is within or below this normal operating temperature range, or only slightly above such range. Therefore, during operation of the assembly, the conductive material wholly or partially liquefies. The cores desirably have melting temperatures well above the operating temperature range of the microelectronic elements, so that the material constituting the cores remains solid during normal operation. The liquid conductive material allows movement of the cores relative to the microelectronic elements, and allows movement of the microelectronic elements relative to one another. This provides compensation for differential thermal effects and other effects which tend to cause relative movement of the elements during service. For example, the first microelectronic elements may be a semiconductor chip and the second microelectronic element may be a circuit panel or a packaging element which is connected to a circuit panel in service. The molten layers of the composite conductive elements will allow movement of the circuit panel relative to the chip. Moreover, the connection remains fatigue-free.

Typically, the layer of conductive material in each conductive element is about 50 μm or less thick, and the cores are spherical. The thin conductive layer reduces the amount of relatively expensive low-melting alloy required in the assembly. The spherical cores facilitate movement of the microelectronic elements relative to one another when the conductive material is in a molten condition. Although the present invention is not limited by any theory of operation, it is believed that the spherical cores roll on one or both microelectronic elements, and thus act much like miniature bearing balls. The cores can be formed from essentially any material. In a particularly desirable arrangement, the cores may be readily deformable to facilitate vertical or Z-direction movement of the microelectronic elements relative to one another in service. The cores may be solid throughout or else may be hollow. Preferably, the assembly also includes a filler disposed between the microelectronic elements and surrounding the conductive elements. The filler can help to constrain the liquid conductive material when the conductive material is in the molten state. The filler desirably is a compliant material such as a gel, elastomer, foam or mesh so that the filler can deform to accommodate the relative movement of the microelectronic elements.

In a particularly preferred arrangement, the second microelectronic element includes a flexible film having a first surface facing in a first vertical direction toward the first microelectronic element and having a second surface facing in a second vertical direction away from said first microelectronic element. The film has contacts on its first surface, which are connected to contacts on the first microelectronic element by the conductive elements. The film also has contacts on its second surface electrically connected to the first-surface contacts and conductive elements. The second surface contacts may be offset from the first-surface contacts and conductive elements in one or more lateral directions transverse to the vertical directions. In this arrangement, the film can bend or bow to accommodate vertical movement of the second-surface contacts relative to the first microelectronic element. Stated another way, the assembly provides good Z-direction compliance, which facilitates mounting of the assembly and also facilitates testing of the assembly prior to mounting. The first microelectronic element may be a semiconductor chip having a front surface facing toward the film or second microelectronic element.

Another aspect of the invention provides methods of operating a microelectronic assembly having conductive elements connecting first and second microelectronic elements. A method according to this aspect of the invention desirably includes the step of bringing said assembly to an operating temperature above the melting temperature of a conductive material incorporated in the conductive elements but below the melting temperature of cores in the conductive elements. In this condition, the cores are free to move relative to the microelectronic elements and the microelectronic elements are free to move relative to one another. The cores and conductive material conduct electrical signals, heat or both between the microelectronic elements while the microelectronic elements are at operating temperature. One or both of the microelectronic elements may include a flexible sheet and the flexible sheet may deform during operation. Movement of the cores allowed by the molten conductive material accommodates deformation of the flexible sheet. A filler such as a compliant material surrounding the conductive elements may constrain the conductive material while the conductive material is in a molten condition. Desirably, the filler maintains the conductive elements in compression when the assembly is in its normal range of operating temperatures. For example, the coefficient of thermal expansion ("CTE") of the filler may be equal to or greater than the CTE of the cores in the conductive elements, and the filler may be applied and cured at a temperature at or near the top of the normal operating temperature range.

Yet another aspect of the invention provides conductive elements. A conductive element according to this aspect of the invention desirably includes a spherical core and a layer of a conductive material on the core, the conductive material having a melting temperature less than about 150° C., and typically less than 85° C. The core has a melting temperature above the melting temperature of the conductive material. Conductive elements according to this aspect of the invention can be used in assemblies and methods as discussed above.

These and other objects, features and advantages of the present invention will be more readily apparent from the detailed description of the preferred embodiment set forth below and taken in connection with the accompanying drawings.

DETAILED DESCRIPTION OF THE PREFERRED EMBODIMENTS

Figure 1:
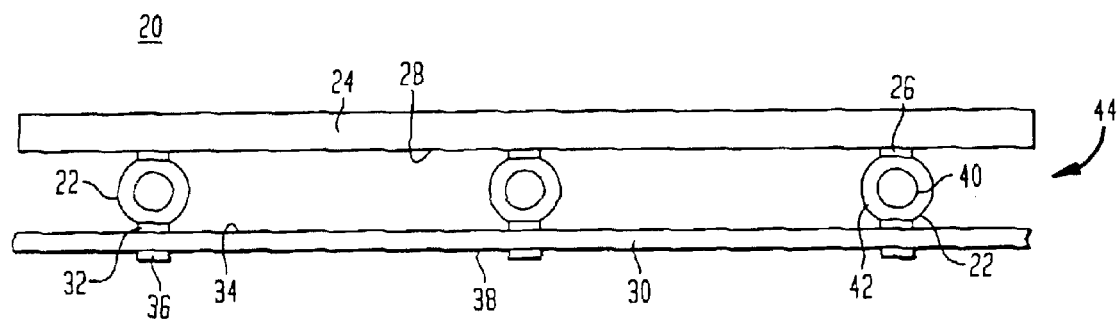
FIG. 1 is a diagrammatic sectional view depicting an assembly according to one embodiment of the invention during one stage of its manufacture.

One embodiment of the present invention provides a microelectronic assembly 20 (FIG. 1) having composite conductive elements 22. The microelectronic assembly 20 preferably includes a first microelectronic element 24, such as a semiconductor chip, having a plurality of contacts 26 on a front face 28 thereof. The assembly 20 also includes a second microelectronic element 30, such as a flexible dielectric film, having first contacts 32 on a first surface 34 thereof. The dielectric film 30 may also have second contacts 36 on a second surface 38 thereof which are in registration with the first contacts 32. A plurality of the composite conductive elements 22 are preferably provided over the contacts 32 on the first surface 34 of the dielectric film 30. Each composite conductive element 22 desirably includes a core 40 which is preferably in the shape of a sphere. The core 40 may include a conductive material, such as metal, or a dielectric (non-conductive) material, such as an elastomer. The core 40 may be entirely solid throughout or may comprise a hollow sphere. Moreover, the core 40 may be substantially rigid or compliant. Although the cores can be of essentially any size, each core preferably is between about 0.15 and 1.5 mm and more desirably between about 0.25 mm and about 0.5 mm in diameter. All of the cores used in a particular assembly should be of substantially the same diameter.

Each composite conductive element 22 includes a layer of a conductive material 42 which surrounds the core 40. The layer of conductive material 42 is preferably about 25–50 microns or less. The layer of the conductive material 42 preferably conducts electricity and heat; however, in other embodiments the conductive material 42 may only conduct electricity. In still further embodiments the conductive material 42 may only conduct heat. In other words, although the composite conductive elements 22 are preferably used to simultaneously conduct both electricity and heat, the composite conductive elements 22 may be used in certain embodiments to conduct only heat. For example, the composite conductive elements 22 may be disposed between the rear surface of a semiconductor chip and a heat sink for conducting heat therebetween.

The melting temperature of the conductive material (hereafter referred to as "fusible conductive material") desirably is within or below the normal operating temperature of the microelectronic elements in the assembly 20, or only slightly above the normal operating temperature range. The normal, expected range of operating temperatures of the microelectronic elements will depend upon the configuration and composition of the assembly 20, and upon the environment encountered during operation. Typical silicon-based microelectronic elements are designed to operate at about 40° C. to about 85° C. Where the fusible conductive material 42 melts or freezes over a range of temperatures, the term "melting temperature" as used in this disclosure should be understood as referring to the solidus temperature, i.e., the temperature at which the fusible conductive material 42 begins to melt (when heated slowly) or completes freezing (when cooled slowly). Preferably, the melting temperature of the fusible conductive material 42 is above normal room temperature (20° C.) so that the fusible conductive material 42 can be handled conveniently in solid form during assembly steps. Thus, the fusible conductive material 42 may have a melting temperature of less than about 150° C., preferably less than about 125° C., more preferably less than about 100° C., even more preferably less than about 85° C. and most preferably less than about 65° C. For fusible conductive material having melting temperatures below 65° C., temperatures between about 25° C. and 65° C. are particularly preferred, and melting temperatures between about 35° C. and about 55° C. are most preferred. However, lower melting temperatures can be employed if the production process is altered to accommodate the lower melting temperature. For example, where a composite conductive element 22 includes a fusible conductive material 42 which melts at a temperature below room temperature is employed, the fusible conductive material 42 and the adjacent parts can be kept at sub-ambient temperatures during those process steps so that the fusible conductive material 42 remains in a solid state. Conversely, where the operating temperature of the microelectronic elements is higher than the typical ranges mentioned above, fusible conductive materials which melt at higher temperatures can be employed.

Among the suitable low-melting point materials which may be used as the layer of fusible conductive material 42 are the following solder compositions:

| ELEMENT | COMPOSITION 1 WEIGHT % | COMPOSITION 2 WEIGHT % |
|---|---|---|
| Sn | 18.5 | 10.5 |
| Bi | 45 | 40 |
| Pb | 24 | 21.5 |
| In | 10 | 20 |
| Cd | 9.5 | 8 |
| Melting Temperature | 55° C. | 50° C. |

Solders having compositions intermediate between the two low-melting point solders illustrated in Table 1 can be used. Other suitable low-melting solders include the solder sold under the trademark Indalloy by the Indium Corporation of America, located in Clinton, N.Y. For example, Indalloy Number 8 has a melting point of about 93° C., whereas Indalloy Number 117 has a melting point of about 47° C. Still other low-melting solders include other combinations of metals selected from the group consisting of cadmium, bismuth, tin, lead and indium in various proportions, with or without other metals. Additional fusible conductive materials include gallium, mercury and mercury containing alloys.

After the composite conductive elements 22 are connected to the contacts 32 on the first surface 34 of the flexible dielectric sheet 30, the semiconductor chip 24 is assembled to the dielectric sheet so that the first surface 34 of the flexible sheet 30 faces the front face 28 of the semiconductor chip 24, the confronting faces 28 and 34 defining a space 44 therebetween. The contacts 26 on the semiconductor chip 24 are preferably aligned with the contacts 32 on the first surface of the dielectric sheet 30 and with the composite conductive elements 22 disposed on the dielectric sheet contacts 32. The alignment between the chip contacts 26 and the composite conductive elements 22 need not be perfect. The alignment need only be close enough so that each chip contact 26 touches the correct composite conductive element 22 during the melting step discussed below so that each chip contact 26 does not touch any other composite conductive element.

While the chip contacts 26 are held in engagement with the composite conductive elements 22, the layer of the fusible conductive material 42 surrounding the core 40 of each composite conductive elements 22 is brought to a temperature above its melting temperature so that the fusible conductive material layer 42 at least partially liquefies and flows into intimate engagement with the exposed surfaces of the chip contacts 26. Alternatively, the dielectric sheet 30 and the composite conductive elements 22 may be at a temperature above the melting temperature of the layer of the fusible conductive material 42 prior to engagement with the semiconductor chip 24. The chip contacts 26 may also be preheated to a temperature above the melting temperature of the fusible conductive material 42 before engagement with the composite conductive elements 22.

The fusible conductive material 42 preferably wets to the surfaces of the chip contacts 26. While the fusible conductive material 42 is in at least a partially molten condition, a plate (not shown) holds the flexible dielectric sheet 30 in a substantially planar condition so that the second contacts 36 on the second surface 38 of the flexible dielectric sheet 30 are substantially co-planar with one another. While the second contacts 36 are aligned in this manner, the composite conductive elements 22 are cooled to below the melting temperature of the fusible conductive material 42, such as by cooling the entire microelectronic assembly including the supporting plates. In other embodiments, the flexible dielectric sheet 30 may be stretched and/or held taut using a substantially rigid ring (not shown). For example, the dielectric sheet 30 may be stretched in the ring in the manner disclosed in U.S. Pat. No. 5,518,964, the disclosure of which is hereby incorporated by reference herein and a copy of which is annexed hereto.

Figure 2:
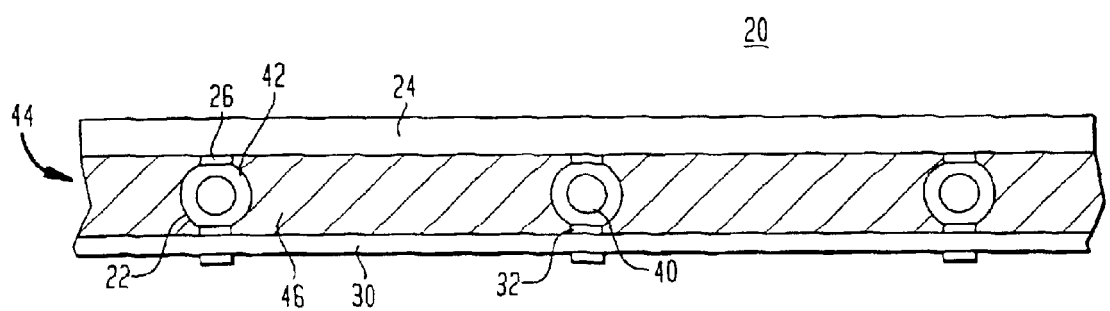
FIG. 2 is a view similar to FIG. 1, showing the same assembly at after completion of manufacture.

Referring to FIG. 2, after the composite conductive elements 22 assembled between the semiconductor chip 24 and the flexible dielectric film 30 and have been completely frozen, a flowable liquid material 46 is introduced into the space 44 between the chip 24 and the flexible sheet 30 so that the flowable material 46 fills the space 44 and intimately surrounds the composite conductive elements 22 and the adjacent surfaces of contacts 26 and 32. The flowable material also intimately engages the front face 28 of the semiconductor chip 24 and the first surface 34 of the flexible dielectric film 30. During introduction of the flowable material 46, the dielectric film 30 is preferably maintained in a planar condition by either the supporting plate or the frame described above. After the space 44 has been completely filled by the flowable material 46, the flowable material 46 is cured to form a compliant layer occupying the space 44 and intimately surrounding the composite conductive elements 22 and the contacts 26 and 32. The compliant layer 46 may be a solid or a gel and preferably comprises a silicone elastomer or a flexibilized epoxy. The compliant layer 46 is preferably CTE matched with the composite conductive elements 22 to minimize the effects of thermal cycling. The flowable material 46 is preferably introduced into the space 44 and cured at a temperature which is below the melting temperature of the fusible conductive material 42. In further embodiments, the flowable material 46 may be introduced around the composite conductive elements 22 when the fusible conductive material 42 surrounding the cores 40 is in a liquid state. The fusible conductive material 42 may then be frozen before the flowable material cures or after the flowable material cures.

In further embodiments, the CTE of the cured flowable material or filler, and the curing temperature, are selected so that when the assembly is in the normal operating temperature range, the filler will maintain the conductive elements in compression. Thus, where the cured flowable material or filler 46 has a higher coefficient of thermal expansion than the composite conductive elements, the filler preferably is cured at a temperature which is at or near the upper end of the operating temperature range of the assembly. As a result, during operation of the assembly the composite conductive elements will be under compression, thereby ensuring that the composite conductive elements maintain a reliable electrical interconnection between the chip and the dielectric sheet. If the cured filler has a lower CTE than the composite conductive elements, curing preferably occurs at a temperature below the normal operating temperature range, or at the low end thereof.

Figure 3:
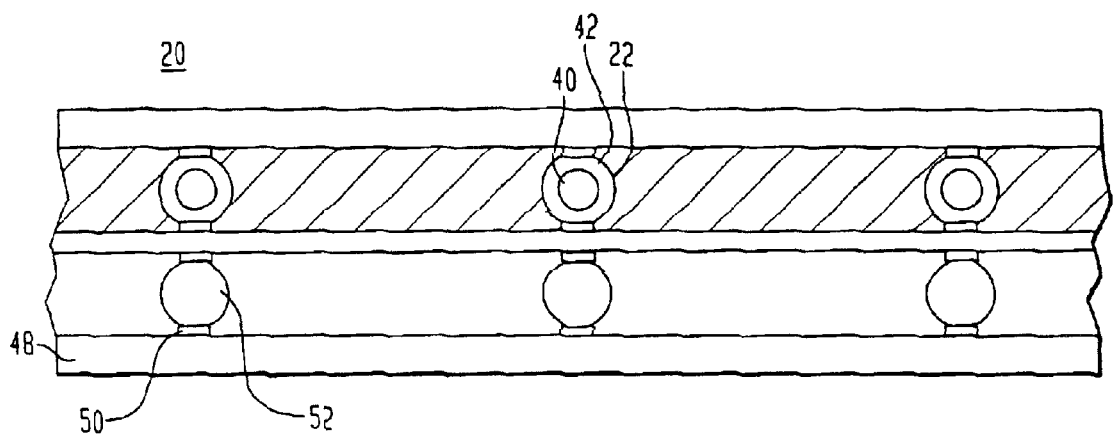
FIG. 3 is a view similar to FIG. 1, showing the same assembly in use.

Referring to FIG. 3, the finished microelectronic assembly 20 may then be connected to an external circuit element 48, such as a printed circuit board, by juxtaposing the second contacts 36 on the second surface 38 of the flexible dielectric film 30 with contact pads 50 on the printed circuit board 48. The flexible dielectric film 30 and the printed circuit board 48 are then electrically interconnected with a conductive material 52 such as solder. During operation of the assembly 20, the layer of the fusible conductive material 42 of each composite conductive element 22 will preferably liquefy at normal operating temperatures. When the fusible conductive material 42 has obtained a liquid or molten state, the cores 40 will be free to move in lateral directions, thereby providing the assembly 20 with excellent X-axis and Y-axis compliance, i.e., compliance allowing movement of the dielectric film 38 and contacts 32 thereon relative to chip 24 and contacts 26. This minimizes stress on the solder bonds 52 between the contacts pads of the substrate and the remainder of the assembly caused by differential thermal expansion and contraction. Depending upon the nature of cores 40, the assembly may also have substantial Z-direction compliance, i.e., compliance in directions perpendicular to the chip surface. Thus, where cores 40 are compressible, as where the cores are formed from elastomeric material, or are hollow, thin-walled flexible structures, the assembly will have appreciable Z-direction compliance. Similarly, the compliance of the assembly can compensate for thermal effects during manufacture. The conductive material layers will liquefy during the soldering operation, and will allow movement of the dielectric film and contacts during heating and cooling associated with the soldering operation.

This embodiment of the present invention provides microelectronic assemblies having excellent compliance so as to enhance the reliability of the electrical connections between microelectronic elements. In addition, the microelectronic assemblies may be manufactured in an economical and efficient manner. The composite conductive elements of the present invention are relatively inexpensive because the cores thereof typically include a relatively inexpensive material such as copper, elastomers (e.g. silicone elastomers) or plastics. The cores may be relatively simple and inexpensive because there is no need for the core to melt during operation; only the thin outer layers of the composite conductive elements must melt in order to provide adequate electrical and thermal interconnections. As a result, the composite conductive elements of the present invention may provide reliable conductive means while reducing the overall cost of the assembly. In addition, each composite conductive element has a core which facilitates handling and placement of the conductive balls. As a result of the core, each composite conductive element can be handled and placed even when the fusible material is liquid or molten because surface tension will hold the layer of fusible material around the core. In contrast, when the conductive balls completely comprise a fusible material, the conductive balls cannot be handled while in a molten or liquid state. Still further, because the amount of low-melting fusible material in each conductive element is minimal, any adverse effects of such material, such as alpha particle emission from heavy elements contained therein, are also minimized.

Figure 4:
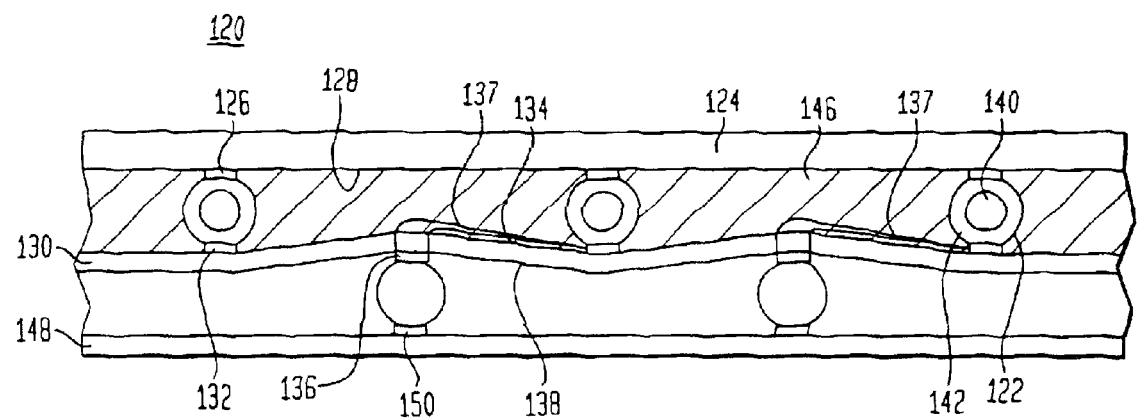
FIG. 4 is a diagrammatic sectional view depicting an assembly according to another embodiment of the invention.

Referring to FIG. 4, a microelectronic assembly 120 in accordance with another preferred embodiment of the present invention is fabricated using materials and methods substantially similar to those described above. However, in this particular embodiment the second contacts 136 on the second surface 138 of the flexible dielectric sheet 130 are offset in a lateral direction from the first contacts 132 on the first surface 134 of the flexible dielectric sheet 130. For example, the where the first contacts are disposed in a grid pattern on one side of the sheet, the second contacts can be disposed in a similar grid pattern on the opposite side of the sheet. The second grid pattern may have the same center-to-center distances as the first grid pattern, but may be offset from the first gird pattern. Alternatively, the second contacts may be "fanned" from the first contacts. Thus, where the contacts on the chip are disposed in a small region such as a line or small pattern, the first contacts 132 are disposed in the same region. The second contacts may be disposed in a larger array, covering a larger region of the sheet surface. Such an arrangement is commonly referred to as a "fan-out" from the chip contacts. In still other embodiments, the chip contacts and hence the first contacts on the sheet may be disposed adjacent the perimeter of the chip, whereas the second contacts may be disposed in an array within the perimeter. Such an arrangement is commonly referred to as a "fan-in". Combinations of these approaches can be used. The second contacts 136 on the second surface are electrically connected to the first contacts. In FIG. 4, these connections are exemplified as traces 137 extending from first contacts 132 along a surface of sheet 130 and vias extending from traces 137 to second contacts 136. This arrangement is merely illustrative, inasmuch as the flexible sheet may include one or more layers of traces on its surfaces or within the sheet, and may also include other elements such as flexible conductive planes, typically used as ground and power planes. As such, this particular embodiment of the present invention provides, in addition to lateral compliance along the X- and Y- axes, outstanding vertical Z-axis compliance even if cores 140 are rigid. As mentioned above, during operation of the assembly 120, the semiconductor chip 124 and the external circuit element 148 heat up and expand. This may cause the contact pads 150 on the external circuit element 148 to move towards the semiconductor chip 124 and the contacts 126 on the front face 128 of the semiconductor chip 124 to move towards the external circuit element 148. For example, such movement may occur if the parts warp upon expansion. The flexible sheet 130 underlying the chip contacts 126 can move downward and the flexible sheet 130 overlying the contact pads 150 on the circuit element 148 can move upward. As the respective contacts move, the flexible sheet 130 bends. This bending, and deformation of compliant layer 146 allows the parts to move relative to one another in the Z-direction which further minimizes the effects of thermal cycling. In addition, when the chip 124 heats up, the layer of the fusible conductive material 142 of each conductive element 122 melts which frees the core 140 thereof to move in lateral (X and Y-axis) directions. This also facilitates bending of the sheet and Z-axis compliance. The resilience of the flexible sheet 130 and the compliant layer 146, in conjunction with the fusible conductive material 142, maintains electrical contact between the semiconductor chip 124 and the external circuit element 148. The Z-axis compliance afforded by this and other embodiments of the invention can also be used to facilitate testing of the assembly. Thus, where the second-surface contacts 136 are engaged with a rigid test fixture (not shown), the Z-axis compliance will allow all of the contacts to engage the fixture even if the contacts or the fixture are not perfectly coplanar.

In a variant of the approach shown in FIG. 4, the composite conductive elements are replaced by conventional solder balls or other connections which remain rigid during operation. Here again, the first contacts and the connections between the first contacts and the chip are laterally offset from the second contacts and the connections between the second contacts and the external circuit element 148. Also, the sheet 130 is flexible and held away from the external circuit element and chip by the connections. Under these conditions, flexure of sheet 130 can still allow some movement of the chip relative to the external circuit element, particularly in the Z or vertical direction. In such an embodiment, the space between the sheet and chip may be provided with a filler, which desirably is compliant. A similar filler may be provided between the sheet and the external circuit element.

Figure 5:
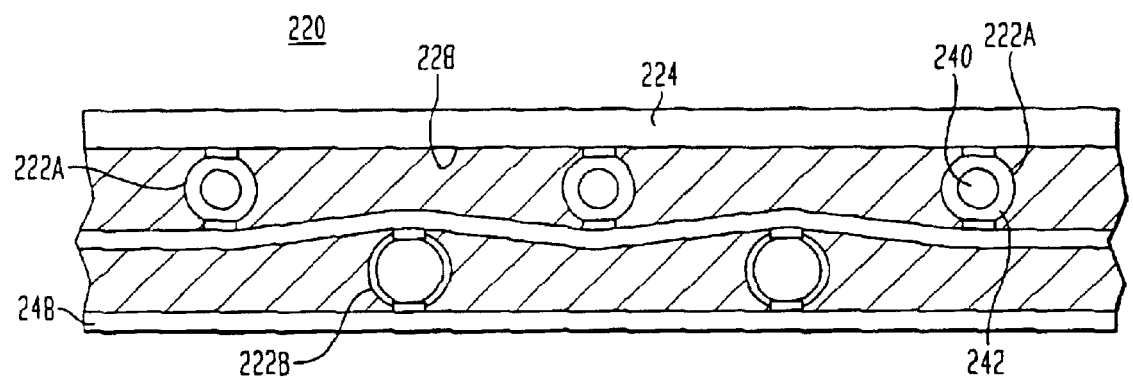
FIG. 5 is a view similar to FIG. 4 depicting an assembly according to yet another embodiment of the invention.

Referring to FIG. 5 in still further preferred embodiments of the present invention, a microelectronic assembly 220 may be fabricated using techniques substantially similar to those described above. However, in these particular preferred embodiments a first set of composite conductive elements 222A are provided between the front face 228 of the semiconductor chip 224 and the first surface 234 of the flexible dielectric element 230. A second set of composite conductive elements 222B are provided between the second surface 238 of the flexible dielectric sheet 230 and the contact pads 250 of the external circuit element 248. The composite conductive elements 222A and 222B preferable provide electrical and thermal connections between the semiconductor chip 224 and the circuit board 248. The assembly 220 also preferably includes a compliant interface which minimizes the stresses on the electrical connections during thermal cycling so as to maintain the electrical connections between the elements. As mentioned above, the composite conductive elements 222A and 222B electrically interconnect the semiconductor chip 224 and the external circuit element 248. When the assembly 220 has reached a predetermined operating temperature, the fusible conductive material layer 242 surrounding the core 240 transforms into a liquid or molten state, thereby providing the assembly 220 with excellent vertical and lateral compliance. The composite conductive elements also preferably conduct heat so that heat may be dissipated from the assembly.

In certain embodiments, the second microelectronic element may include a substantially rigid substrate. Although a rigid substrate would provide for minimal Z-compliance, the assembly would still provide for lateral compliance.

Figure 6:
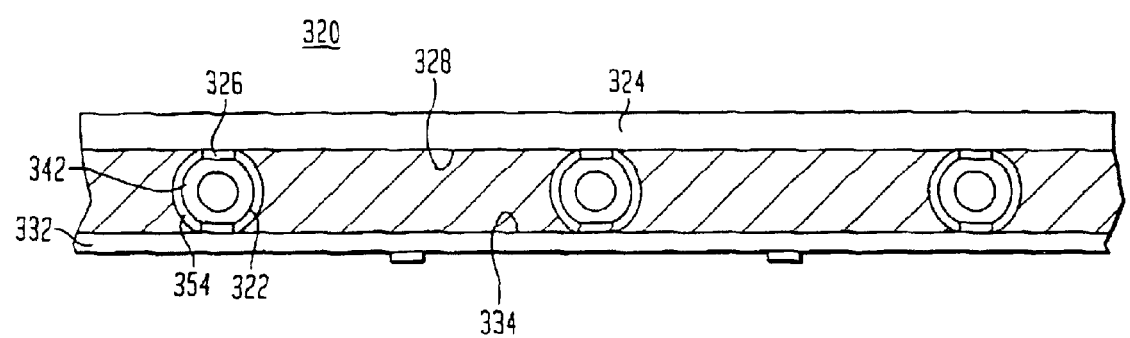
FIG. 6 is a diagrammatic sectional view depicting an assembly according to a further embodiment of the invention.

Referring to FIG. 6, in certain preferred embodiments a polymer such as a polyparaxylene coating 354 (also referred to by the trade name Paralyene) may be provided over the composite conductive elements 322. The polyparaxylene coating 354 is preferably a conformal coating which fully encompasses the composite conductive elements 322 and the adjacent regions of the contacts 326 on the front face 328 of the semiconductor chip 324 and the first surface 334 of the flexible sheet 332. The polyparaxylene coating 354 extends between the respective confronting surfaces 334 and 328 of the flexible dielectric sheet 332 and the semiconductor chip 324 and may cover portions of the confronting surfaces 334 and 328 as well. The coating 354 helps to maintain the composite conductive elements 322 in place when the fusible conductive material 342 is in a molten condition and also helps to preserve the electrical isolation of the composite conductive elements 322 from one another. The polyparaxylene coating may also prevent cross-contamination of the fusible conductive material 342 and the compliant layer 346. In other words, the coating 354 may prevent the fusible conductive material 342 and the material of a compliant layer 346 from diffusing into one another.

Figure 7:
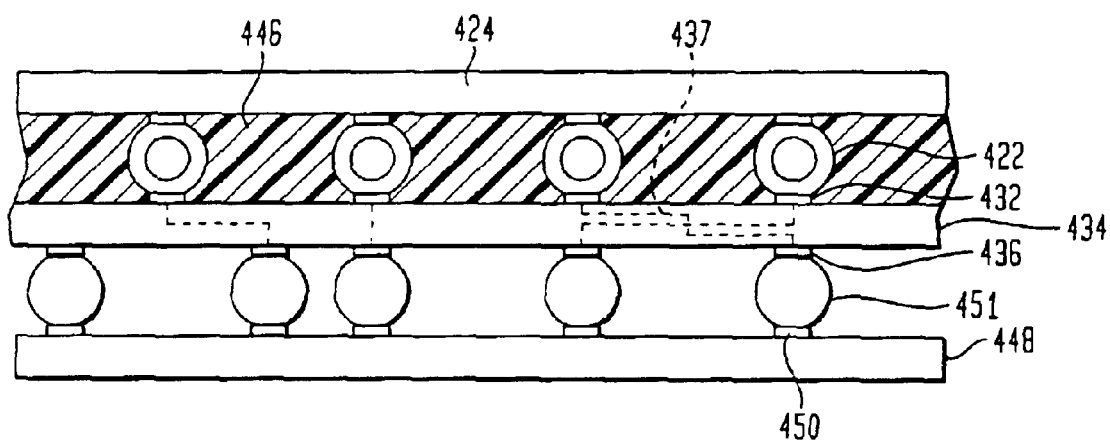
FIG. 7 is a view similar to FIG. 6 but depicting an assembly in accordance with yet another embodiment of the invention.

An assembly according to yet another embodiment of the invention (FIG. 7) includes a first element in the form of a semiconductor chip 424 and a second element 434 in the form of a rigid interposer having first contacts 432 facing toward the chip and second contacts 436 facing away from the chip. The first and second contacts of interposer 434 are connected to one another by internal wiring layers 437 disposed within the interposer. The assembly further includes a printed wiring board ("PWB") or third element 448. The first contacts 432 of the interposer are connected to the contacts of the chip by composite conductive elements 422 as discussed above, each including a core and a coating of low-melting material. The second contacts 436 of the interposer are connected to contacts 450 on PWB 448 by conventional solder balls 451. The filler 446 surrounding the composite conductive elements in this embodiment is not compliant, but instead is a rigid material such as a hard epoxy compound. The CTE of interposer 434 is between the CTE of chip 424 and the CTE of PWB 448. In this embodiment, the composite conductive elements provide fatigue-free connections between the chip and the interposer. Some physical strain may occur in filler layer 446 during thermal cycling, but this will not cause fatigue of the electrical connections. In a further variant, solder balls 451 can be replaced by additional composite conductive elements similar to composite elements 422.

In still further variants, the filler surrounding the composite elements may be omitted entirely. The cores of the composite elements will retain the conductive material by surface tension, and will support the first and second elements of the assembly, when the conductive material is in the liquid state. Desirably, such an assembly is provided with an external package to prevent application of substantial forces to the first and second elements, and to protect the conductive material from oxidation.

As these and other variations and combinations of the features discussed above can be employed, the foregoing description should be taken by way of illustration rather than by way or limitation of the invention.

What is claimed is:

1. A microelectronic assembly comprising:
 (a) first and second microelectronic elements; and
 (b) a plurality of composite conductive elements, each said composite conductive element including a core and a layer of a conductive material surrounding the core, said conductive material having a melting temperature less than about 150° C., said cores having a melting temperature higher than said conductive material, said conductive elements being disposed between said microelectronic elements and connecting said microelectronic elements to one another.

2. An assembly as claimed in claim 1 wherein said melting temperature conductive material of said conductive material is less than about 85° C.

3. An assembly as claimed in claim 1 wherein said microelectronic elements have a normal operating temperature range and wherein said melting temperature of said conductive material is within or below said normal operating temperature range.

4. An assembly as claimed in claim 1 wherein said layer of conductive material in each said conductive element is about 50 μm or less.

5. An assembly as claimed in claim 1 wherein each said core is spherical.

6. An assembly as claimed in claim 1 wherein each said core is hollow.

7. An assembly as claimed in claim 1 wherein each said core is solid throughout.

8. An assembly as claimed in claim 1 wherein said cores are substantially rigid.

9. An assembly as claimed in claim 1 wherein said cores are compliant.

10. An assembly as claimed in claim 1 wherein said second microelectronic element includes a flexible film having a first surface facing in a first vertical direction toward said first microelectronic element and having a second surface facing in a second vertical direction away from said first microelectronic element.

11. An assembly as claimed in claim 10 wherein said second microelectronic element has contacts on said second surface offset from said conductive elements in one or more lateral directions transverse to said vertical directions.

12. An assembly as claimed in claim 11 wherein said second microelectronic element has contacts on said first surface electrically connected to said contacts on said second surface and wherein said first microelectronic element includes one or more semiconductor chips having contacts on a front face, said conductive elements electrically connecting said contacts on said front face of said one or more semiconductor chips to said contacts on said first face of said second microelectronic element.

13. An assembly as claimed in claim 12 further comprising a compliant dielectric material disposed between said first and second elements and surrounding said conductive elements.

14. An assembly as claimed in claim 10 wherein said second microelectronic element has contacts on said first and second surfaces electrically connected to one another, and wherein said first microelectronic element includes one or more semiconductor chips having contacts on a front face, said conductive elements electrically connecting said contacts on said front face of said one or more semiconductor chips to said contacts on said first face of said second microelectronic element.

15. An assembly as claimed in claim 13 further comprising a compliant dielectric material disposed between said first and second elements and surrounding said conductive elements.

* * * * *